(12) United States Patent
Browning

(10) Patent No.: US 6,629,193 B1
(45) Date of Patent: Sep. 30, 2003

(54) SOLID-STATE INFORMATION STORAGE DEVICE

(75) Inventor: James V. Browning, Boise, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 200 days.

(21) Appl. No.: 09/695,793

(22) Filed: Oct. 24, 2000

(51) Int. Cl.7 .............................................. G06F 12/00
(52) U.S. Cl. ........................ 711/104; 711/116; 711/115; 365/48; 365/97; 365/173
(58) Field of Search ................................ 711/104, 115, 711/102, 103, 116; 365/33, 48, 66, 97, 171, 173, 55; 361/761, 760

(56) References Cited

U.S. PATENT DOCUMENTS

| | | | | |
|---|---|---|---|---|
| 5,557,596 A | * | 9/1996 | Gibson et al. ............... | 365/118 |
| 6,097,625 A | * | 8/2000 | Scheuerlein ................ | 365/171 |
| 6,172,902 B1 | * | 1/2001 | Wegrowe et al. .......... | 365/129 |
| 6,195,511 B1 | * | 2/2001 | Harada ....................... | 396/300 |
| 6,404,647 B1 | * | 6/2002 | Minne' ...................... | 361/684 |
| 2001/0018772 A1 | * | 8/2001 | Topham et al. ............. | 711/113 |

OTHER PUBLICATIONS

Storage Systems Overview, http://web.archive.org/web/200008160002540/http://hpl.hp.com/research/storage.html, pp. 1–3, Aug. 16, 2000.*

HP Flaunts New Tech to Raise Lab Profile, CNET News—Enterprise Computing, http://web/archive.org./web/20000607003723/news.cnet.com/news/0–1003–200–1430874.html, pp. 1–6, Nov. 5, 1999.*

R. Morochove, "A Quantum Leap Forward in Storage Capacity", http://morochove.com/watch/cw/ff90930.htm, pp. 1–3, Sep. 30, 1999.*

Charles C. Morehouse, "A Vision of Ultra–High Density Memory", IEEE International Conference on Nonvolatile Memory Technology, pp. 30–33, Jun. 1996.*

Kevin Bonsor, "How Magnetic RAM Will Work", http://www.howstuffworks.com/mram/htm/printable.*

David Voss, "Instant Access Memory", http://www.wired.com/wired/archive/8.04/mram_pr.html, pp. 1–5, Apr. 2000.*

* cited by examiner

*Primary Examiner*—Pierre-Michel Bataille

(57) ABSTRACT

The present disclosure relates to an information storage device. The storage device comprises a connector for interfacing the storage device with a host computing device and at least one solid-state memory device contained within the storage device, the memory device holding personal information of a user of the storage device. In a preferred arrangement, the storage device is small in size yet has a large storage capacity such that the user can carry with him or her a large volume of personal information.

18 Claims, 7 Drawing Sheets

SOLID-STATE INFORMATION STORAGE DEVICE

FIELD OF THE INVENTION

The present disclosure relates to a personal information storage device and a method for using the device.

BACKGROUND OF THE INVENTION

In today's information age, people are becoming more and more reliant on information. For instance, it is important to many people to have access to contact information, scheduling information, account information, medical information, electronic mail, and the like, even at remote locations. Through use of various computing devices, people normally can carry such personal information with them. For instance, this information often is stored on portable computing devices such as notebook personal computers (PCs). Such computers provide a relatively convenient means for storing and carrying this information, but can be bulky. Although many people accept this inconvenience in exchange for access to personal information when travelling, personal computers simply are not practical for carrying at all times. Despite the existence of other more easily portable computing devices (e.g., handheld devices), these devices normally lack the storage capacity to hold relatively large amounts of data as can be stored with a PC.

Due to the drawbacks associated with personal computing devices, computer access is often provided to the public in hotels, kiosks, and the like so that the user can, for instance, connect with the Internet, or access/manipulate data the user has saved to a floppy disk. Although the provision of this computer access permits people to obtain personal information without the need for their own personal computing devices, other difficulties arise in accessing information. In particular, interfacing with a foreign computing device can be difficult in that the settings of the device normally are not the same as those to which the user has become accustomed. For instance, the user may be accustomed to a particular "desktop" arrangement that he or she uses with his or her own PC. Accordingly, it may be difficult for the user to acclimate to the foreign computing device.

From the foregoing, it can be appreciated that it would be desirable to have an information storage device with which the user can quickly and easily access large amounts of information, such as personal information, even from a foreign computing device.

SUMMARY OF THE INVENTION

The present disclosure relates to an information storage device. The storage device comprises a connector for interfacing the storage device with a host computing device and at least one solid-state memory device contained within the storage device, the memory device holding personal information of a user of the storage device.

In a preferred arrangement, the storage device is small in size yet has a large storage capacity such that the user can carry with him or her a large volume of personal information. With this storage device, the user may quickly and easily access the information stored on the storage device, even with foreign computing devices.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
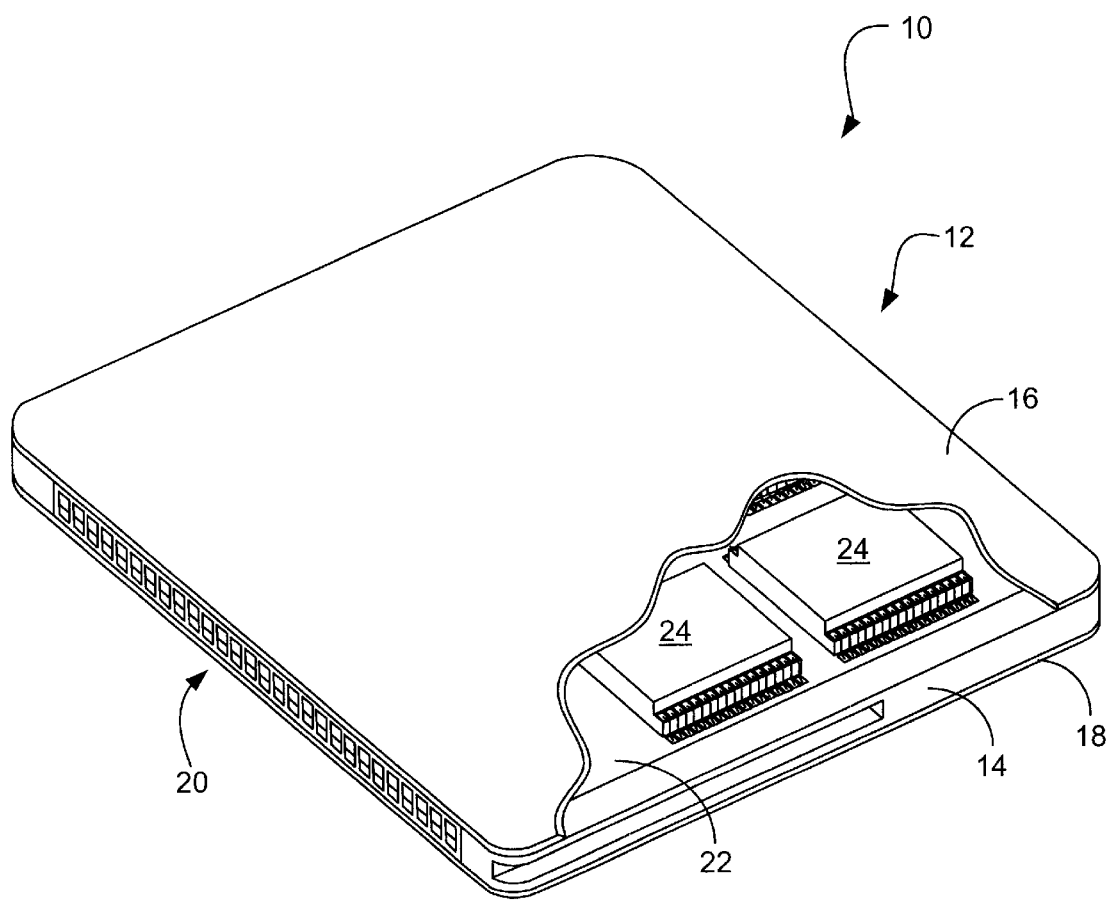
FIG. 1 is one embodiment of a storage device of the present invention.

Referring now in more detail to the drawings, in which like numerals indicate corresponding parts throughout the several views, FIG. 1 illustrates a storage device 10 that can be used to store personal information of a user. Preferably, the storage device 10 is small in size so that the user can easily carry the device wherever he or she goes. For instance, the storage device 10 can have a size and configuration similar to that of conventional flash memory cards used in digital cameras. By way of example, the storage device 10 can have width, length, and thickness dimensions of approximately 1.75 in, 1.5 in, and 0.125 in, respectively.

The storage device 10 typically comprises a housing 12 that, for example, can comprise a frame 14, and two opposed covers 16 and 18. Normally, the frame 14 can include a connector 20 with which electrical communication can be established with the storage device 10. Typically disposed within the housing 12 is a printed circuit board (PCB) 22 that is electrically connected to one or more memory devices 24. Normally, the memory devices 24 are surface mounted to PCB 22 and electrically connected to the PCB such that each memory device is in electrical communication with the other memory devices to provide for storage redundancy. Each of the memory devices 24 typically is extremely small in size so that a plurality of such devices can be provided within the housing 12. For instance, each memory device 24 can have width and length dimensions of approximately 1 cm and a thickness of approximately 20 mm. In such an embodiment, approximately five memory devices 24 can be provided within the storage device 10. As is discussed in greater detail below, the memory devices 24 preferably comprise solid-state memory devices such as atomic resolution storage (ARS) devices or magnetic random access memory (MRAM) devices. By way of example, each memory device 24 has a storage capacity of approximately 2 gigabytes (GB). Therefore, where five such devices are provided, a total storage capacity of approximately 10 GB can be achieved.

Figure 2:
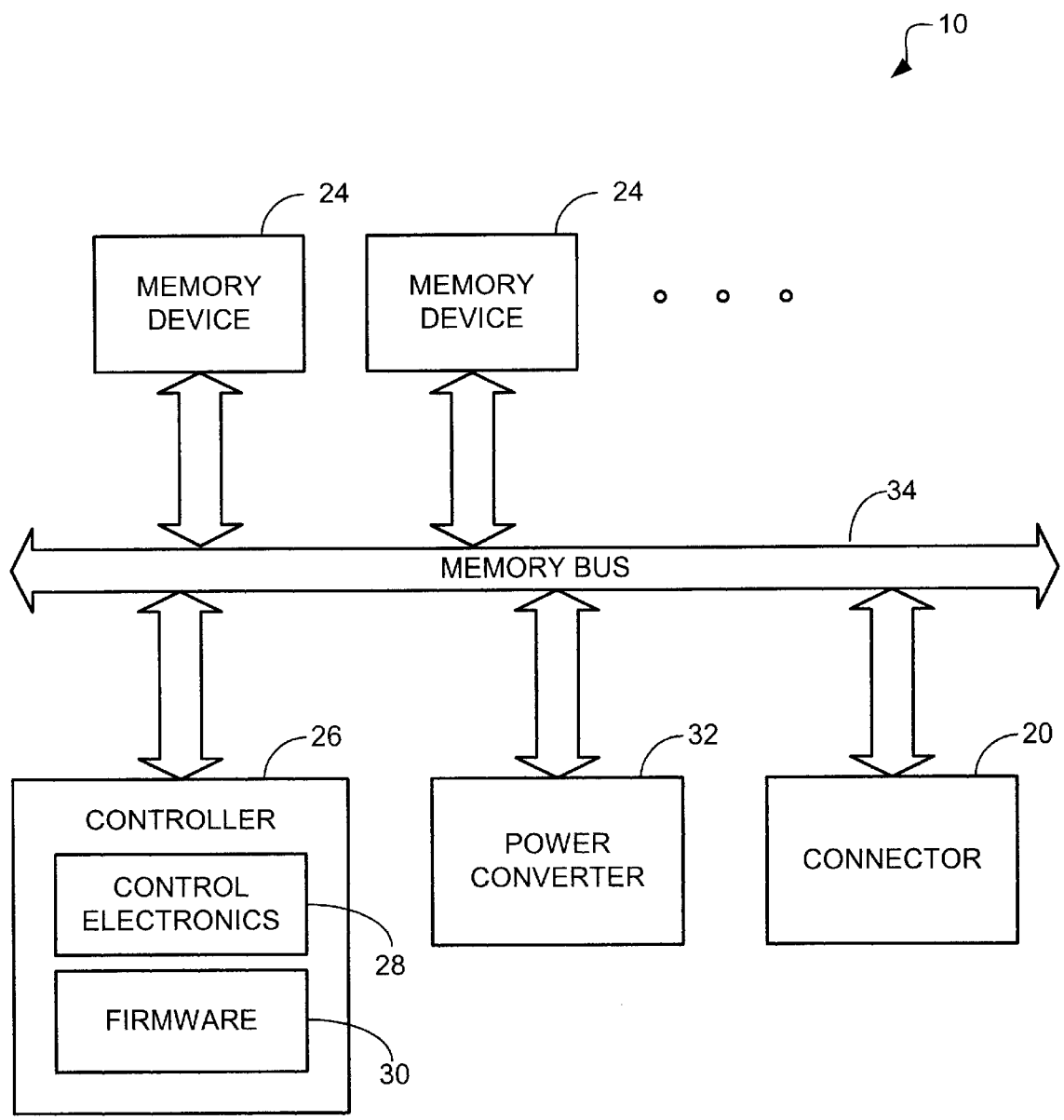
FIG. 2 is a schematic block diagram of the storage device shown in FIG. 1.

FIG. 2 schematically illustrates the components of the storage device 10. As indicated in this figure, the storage device 10 typically further includes at least one controller 26. This controller 26 typically comprises a semiconductor chip that is electrically connected to the memory devices 24 through the PCB 22 (FIG. 1). By way of example, the controller 26 can comprise an integrated circuit including control electronics 28 and firmware 30 with which the controller 26 interfaces with the memory devices 24 and host computing device (not shown), for instance a PC. With further reference to FIG. 2, the storage device 10 can optionally comprise a power converter 32 that increases the voltage received from the host device to ensure that enough power is provided to memory devices 24. Typically, the connector 20, memory devices 24, controller 26, and power converter 32 (if provided) are connected to a memory bus 34 which is formed within the PCB 22 (FIG. 1).

Figure 3A:
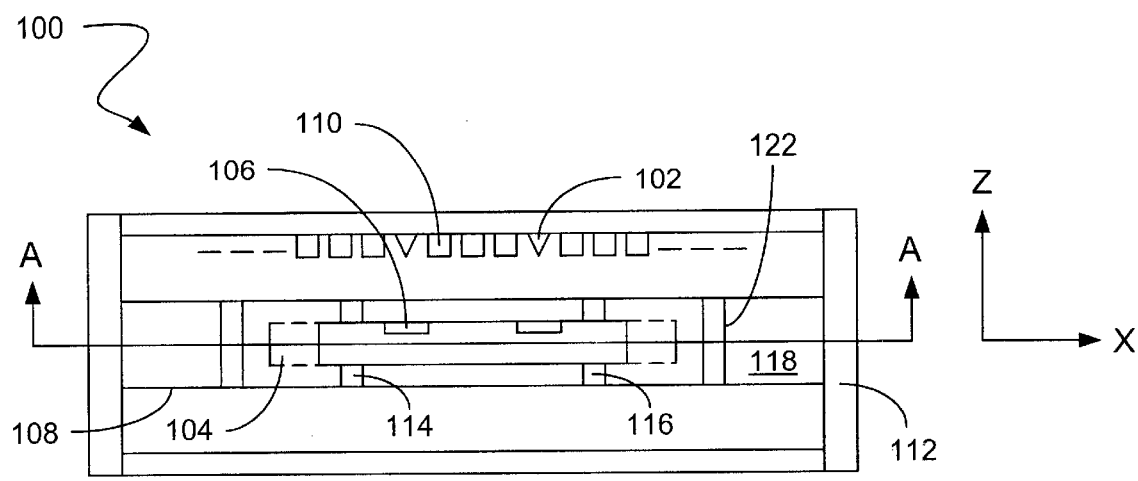
FIGS. 3A–3C are schematic views of the internal structure of a first preferred memory device used in the storage device of FIGS. 1 and 2.
Figure 4:
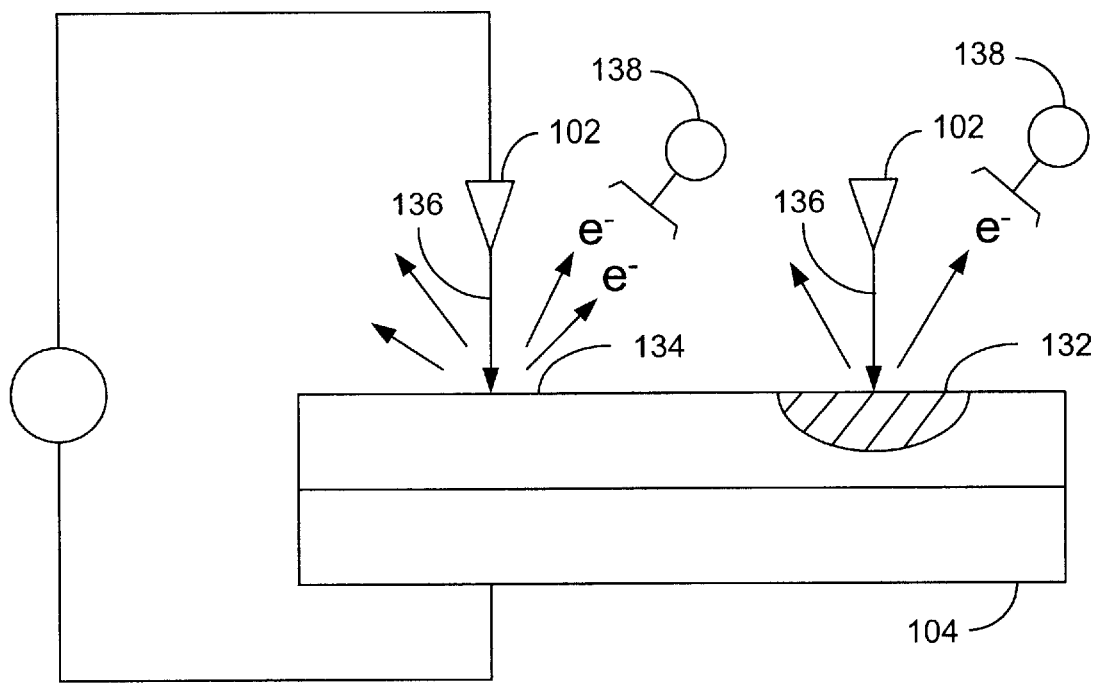
FIG. 4 is a schematic view illustrating field emitters reading from storage areas of the memory device of FIGS. 3A–3C.
Figure 5:
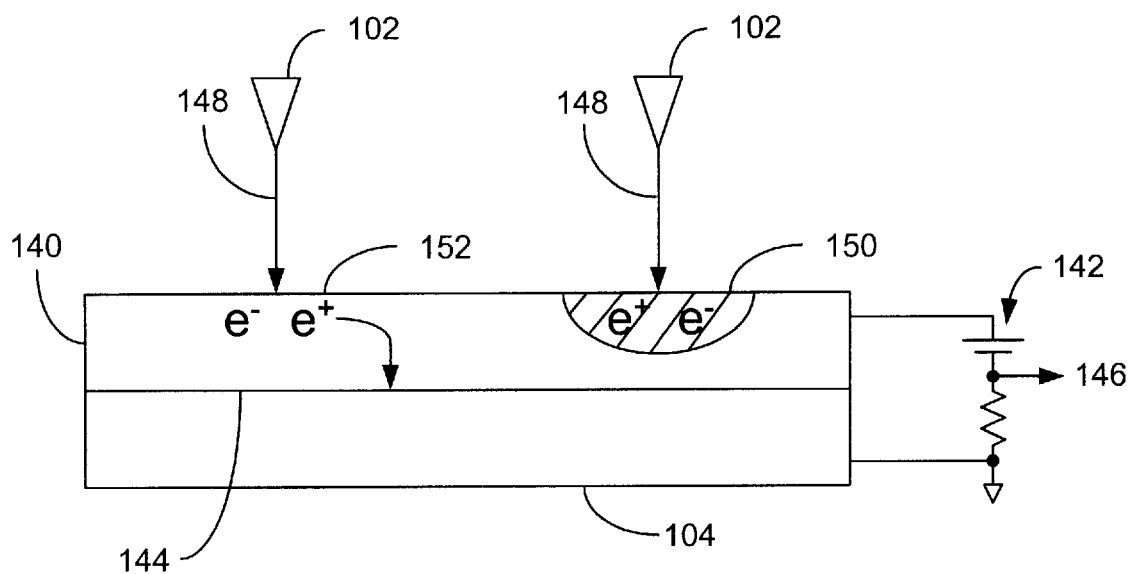
FIG. 5 is a schematic view illustrating a storage medium of the memory device of FIGS. 3A–3C.

Although memory device 24 can comprise substantially any solid-state device capable of storing a large amount of data, the memory devices most preferably comprise ARS devices due to their low cost and high capacity. FIGS. 3–5 illustrate the internal structure of an ARS device 100 suitable for construction of the memory devices 24 described above. The ARS device 100 shown in these figures is disclosed and described in detail in U.S. Pat. No. 5,557,596, which is hereby incorporated by reference into the present disclosure. FIG. 3A shows a side cross-sectional view of the ARS device 100. As indicated in this figure, the device 100 includes a number of field emitters 102, a storage medium 104 having a number of storage areas 106, and a micromover 108 which scans the storage medium with respect to the field emitters or vice versa. In a preferred embodiment, each storage area 106 is responsible for storing one bit of information. Typically, the field emitters 102 are point-emitters having very sharp tips, each tip having a radius of curvature of approximately one nanometer to hundreds of nanometers.

During operation, a predetermined potential difference is applied between a field emitter 102 and a corresponding gate, such as a circular gate 110 which surrounds the emitter. Due to the sharp tip of the emitter 102, an electron beam current is emitted from the emitter towards the storage area 106. Depending upon the distance between the emitters 102 and the storage medium 104, the type of emitters, and the spot size (e.g., bit size) required, electron optics may be useful in focusing the electron beams. Voltage may also be applied to the storage medium 104 to either accelerate or decelerate the field's emitted electrons, or to aid in focusing the field emitted electrons. In a preferred embodiment, a casing 112 maintains the storage medium 104 in a partial vacuum, such as at least $10^{-5}$ torr.

In the embodiment shown in FIG. 3A, each field emitter 102 is associated with a corresponding storage area 106. As the micromover 108 scans the medium 104 to different locations, each emitter 102 is positioned above different storage areas 106. With the micromover 108, an array of field emitters 102 can scan over the storage medium 104. The field emitters 102 are responsible for reading and writing information on the storage areas 106 by means of the electron beams they produce. Thus, the field emitters 102 are preferably of the type that produce electron beams that are narrow enough to achieve the desired bit density of the storage medium 104, and which provide the power density of the beam current needed for reading from and writing to the medium. A variety of methods are known in the art which are suitable for making such field emitters 102.

In a preferred embodiment, there can be a two-dimensional array of emitters 102. For instance, an array of 100×100 field emitters 102 can be provided with an emitter pitch of approximately 15 micrometers in both the X and Y directions. Each emitter 102 may access bits in tens of thousands to hundreds of millions of storage areas 106. For example, the emitters 102 can scan over the storage medium 104 (which has a two-dimensional array of storage areas 106) with a periodicity of approximately 1 to 100 nanometers between any two storage areas 106, and the range of the micromover can be approximately 15 micrometers. Each of the field emitters 102 can be addressed simultaneously or in a multiplexed manner. As will be appreciated by persons having ordinary skill in the art, a parallel accessing scheme significantly reduces access time and increases the data rate of the storage devices 24. A preferred micromover 108 preferably has sufficient range and resolution to position the field emitters 102 over the storage areas 106 with high accuracy. As a conceptual example, the micromover 108 can be fabricated through a standard semiconductor microfabrication process to scan the medium 104 in the X and Y directions with respect to the casing 112.

Figure 3B:
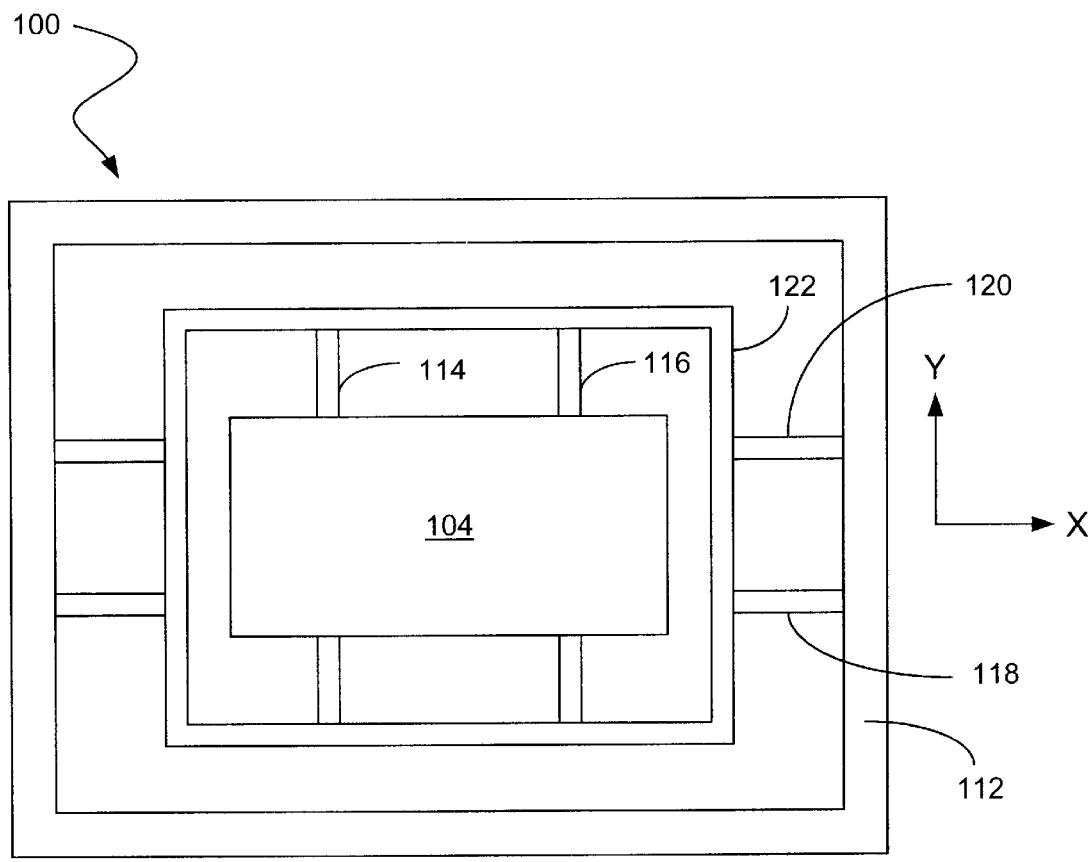

FIG. 3B shows a top view of the cross-section A—A of FIG. 3A. As indicated in this figure, the storage medium 104 can be supported by two sets of thin-walled microfabricated beams 114–120. The faces of the first set (114 and 116) of thin-walled beams are in the X-Z. This first set of beams can be flexed in the X direction to allow the medium 104 to move in the X direction with respect to the casing 112. The faces of the second set (118 and 120) of thin-walled beams are in the X-Z plane. This second set of beams allows the medium 104 to be displaced in the Y direction with respect to the casing 112. As further indicated in FIG. 3B, the beams 114–120 can each be connected to a frame 122, the second set (118 and 120) of beams being connected to the casing 112. With this arrangement, the field emitters 102 can scan over the storage medium 104, or the storage medium can scan over the field emitters 102, in the X-Y directions by, for instance, electrostatic, electromagnetic, or piezoelectric means known in the art.

Figure 3C:
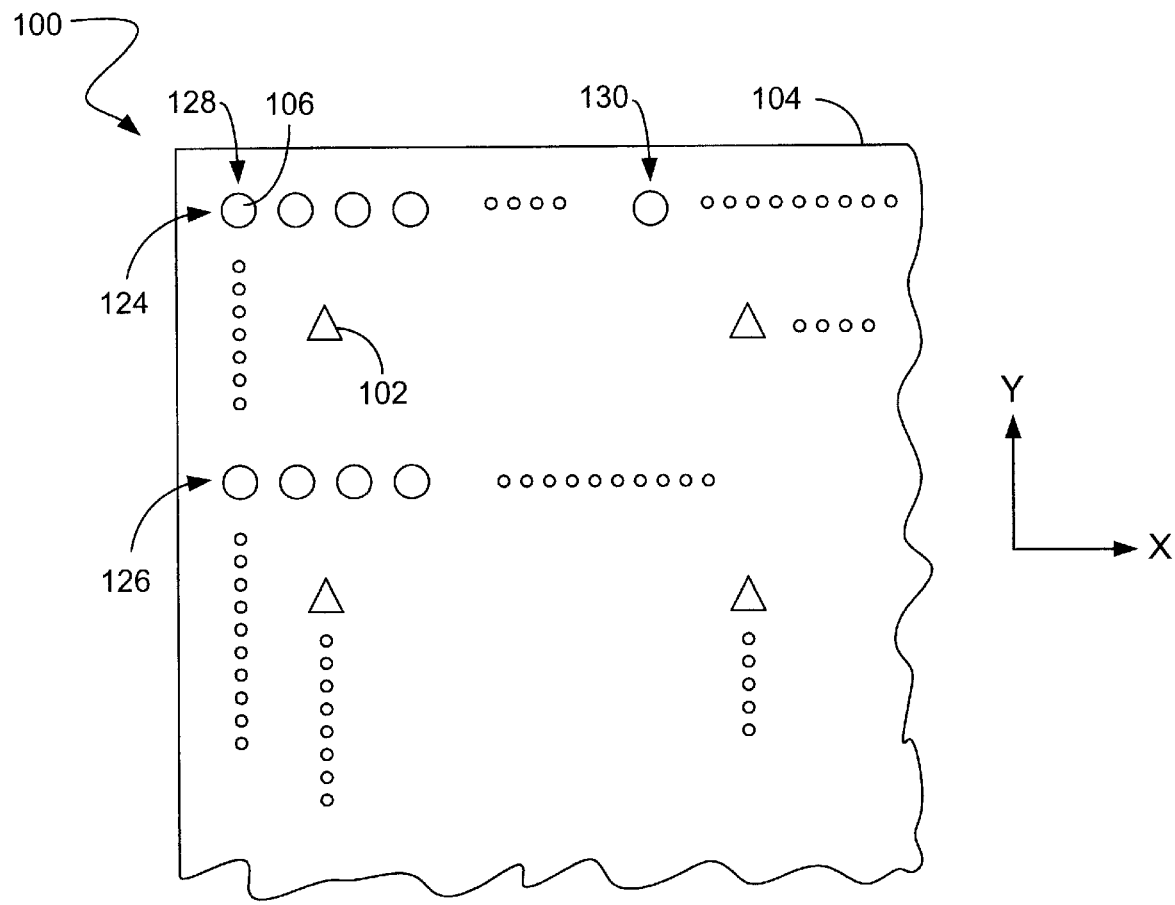

FIG. 3C shows a top view of the ARS device storage medium 104, and illustrates a two-dimensional array of storage areas 106 as well as a two-dimensional array of field emitters 102. To reduce the number of external circuits, the storage medium 104 can be include separate rows, e.g. 124 and 126, of storage areas 106 such that each emitter 102 is responsible for a number of rows. However, in a preferred an embodiment, each emitter 102 need is only responsible for a portion of the entire length of its associated rows. For example, each field emitter 102 can be responsible for the storage areas 106 for its associated rows up along columns 128 and 130. Preferably, each row of storage areas accessed by a single field emitter 102 is connected to a single external circuit. To address a storage area 106, the emitter 102 responsible for that storage area is activated and is displaced with the micromover 108 to that storage area 106.

In use, writing is accomplished by temporarily increasing the power density of the electron beam current to modify the surface state of the storage area 106. Reading, on the other hand, is accomplished by observing the effect of the storage area 106 on the electron beams, or the effect of the electron beams on the storage area. Reading is typically accomplished by collecting the secondary and/or backscattered electrons when an electron beam with a lower power density is applied to the storage medium 104. During reading, the power density of the electron beam is kept low enough so that no further writing occurs. In one preferred embodiment, the storage medium 104 is constructed of a material whose structural state can be changed from crystalline to amorphous by electron beams. The amorphous state has a different SEEC and BEC than the crystalline state. This leads to a different number of secondary and backscattered electrons emitted from the storage area 106. By measuring the number of secondary and backscattered electrons, the state of the storage area 106 can be determined. To change from the amorphous to the crystalline state, the beam power density can be increased and then slowly decreased. This increase/decrease heats the amorphous area and then slowly cools it so that the area has time to anneal into its crystalline state. To change from the crystalline to amorphous state, the beam power density is increased to a high level and then rapidly. An example of one such type of material is germanium telluride (GeTe) and ternary alloys based on GeTe.

FIG. 4 schematically illustrates field emitters 102 reading from the storage medium 104. In this figure, the state of one particular storage area 132 has been altered, while the state of another particular storage area 134 has not. When a beam 136 of electrons bombard a storage area 106 (FIG. 3C), both the secondary electrons and backscattered electrons are collected by electron collectors 138. As will be appreciated by persons having ordinary skill in the art, a storage area that has been modified (e.g., area 132) will produce a different number of secondary electrons and backscattered electrons, as compared to an area that has not been modified (e.g., area 134). The number may be greater or lesser depending upon the type of material and the type of modification made. By monitoring the magnitude of the signal current collected by the electron collectors 136, the state of and, in turn, the bit stored in the storage area 106 can be identified.

FIG. 5 illustrates a diode approach for construction of the ARS device 100. In this approach, the storage medium 104 is based on a diode structure 140, which can, for example, comprise a PN junction, a schottky, barrier, or substantially any other type of electronic valve. Although FIG. 5 illustrates a particular external circuit 142, it will be appreciated that this circuit is provided for purposes of example only. In the diode approach, bits are stored by locally altering the surface of the diode 140 in such a way that collection efficiency for minority carriers generated by the altered region is different from that of an unaltered region. The collection efficiency for minority carriers can be defined as the fraction of minority carriers generated by the instant electrons that are swept across the diode junction 144 when it is biased by the external circuit 142 to cause a signal current 146 to flow through the external circuit. In use, the field emitters 102 emit narrow beams 148 of electrons onto the surface of the diode 140 that excite electron-hole pairs near the surface of the diode. Because the diode 140 is reverse-biased by the external circuit 142, the minority carriers that are generated by the incident electrons are swept toward the diode junction 144. Electrons that reach the junction 144 are then swept across the junction. Accordingly, minority carriers that do not recombine with majority carriers before reaching the junction 144 are swept across the junction, causing a current flow in the external circuit 142.

Writing onto the diode 140 is accomplished by increasing the power density of the electron beam 148 enough to locally alter the physical properties of the diode 140. This alteration affects the number of minority carriers swept across the junction 144 when the same area is radiated with a lower power density read electron beam. For instance, the recombination rate in a written area 150 could be increased relative to an unwritten area 152 so that the minority carriers generated in the written area have an increased probability of recombining with minority carriers before they have a chance to reach and cross the junction 144. Hence, a smaller current flows in the external circuit 142 when the read electron beam is incident upon a written area 150 than when it is incident upon an unwritten area 152. Conversely, it is also possible to start with a diode structure having a high recombination rate and to write bits by locally reducing the recombination rate. The magnitude of the current resulting from the minority carriers depends upon the state of the storage area 106, and the current continues the output signal 146 to indicate the bit stored.

Figure 6:
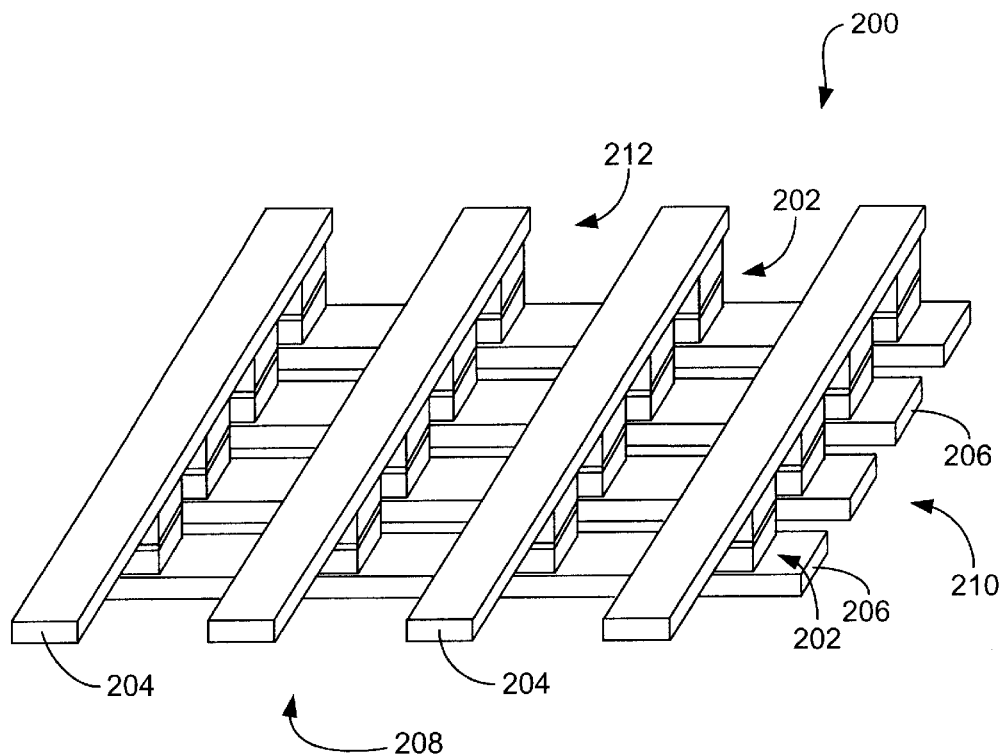
FIG. 6 is a schematic view illustrating the internal structure of a second preferred memory device used in the storage device shown in FIGS. 1 and 2.
Figure 7:
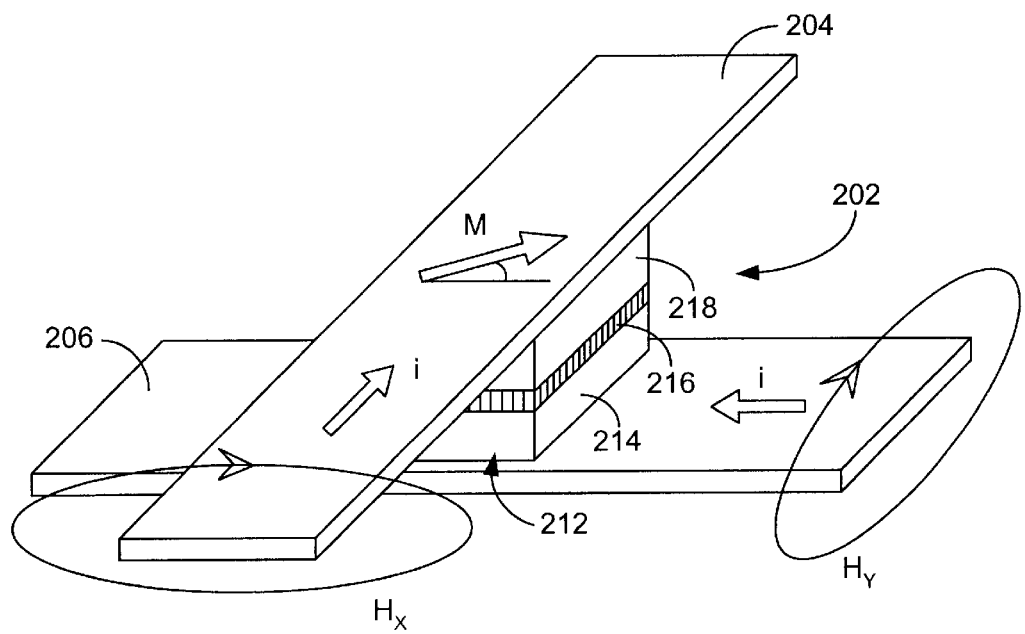
FIG. 7 is a schematic detail view of the memory device shown in FIG. 6.
Figure 8:
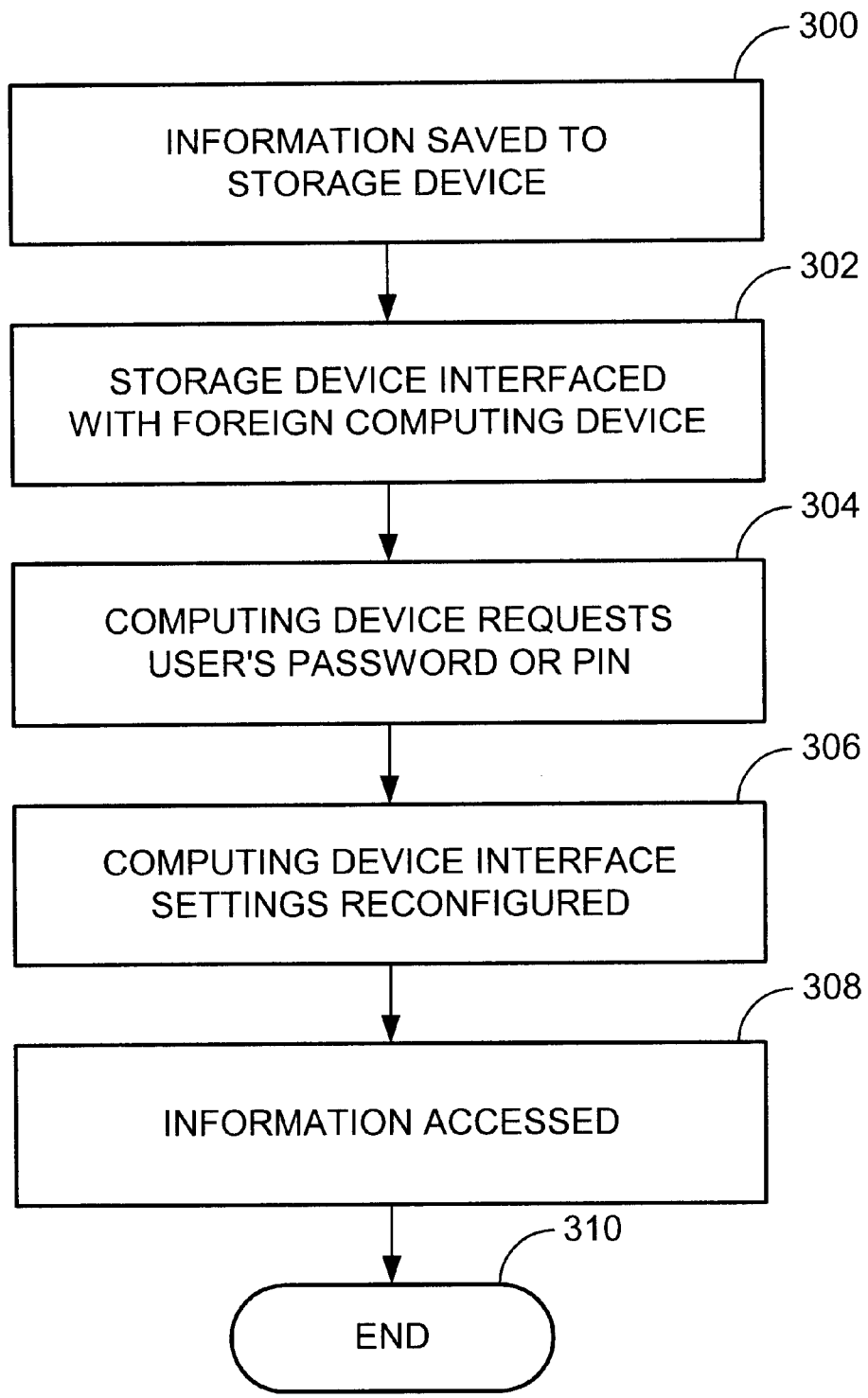
FIG. 8 is a flow diagram of a method for using the storage device shown in FIGS. 1 and 2.

In an alternative preferred arrangement, the memory devices 24 comprise MRAM devices. FIGS. 6 and 7 illustrate the internal structure of an MRAM device 200 suitable for construction of the memory devices 24. As indicated in FIG. 6, the MRAM device 200 is a solid-state device that comprises a plurality of cells 202, which serve as magnetic domains, and a plurality of conductor bars 204 and 206. Typically, the bars 204, 206 are arranged in first and second parallel planes 208 and 210 with the bars of the first plane aligned perpendicularly to the bars of the second plane. Because of this perpendicular arrangement, the bars 204, 206 form crossover points 212. As is illustrated in FIG. 6, one cell 202 is normally disposed intermediate the two planes 208, 210 at each crossover point 212 formed by the bars 204, 206. Therefore, as shown in the detail view of FIG. 7, each cell 202 is sandwiched between a first bar 204 and a second bar 206 at the two bars' crossover point 212. As indicated in FIG. 8, each cell 202 normally comprises a pinned magnetic layer 214 (i.e., a layer which is permanently magnetized in a predetermined direction), a relatively thin dielectric layer 216, and a free magnetic sense layer 218 (i.e., a layer whose magnetization direction can be selectively changed). By way of example, the bars 204, 206 and their associated cells 202 can be formed on one or more substrates to create an integrated device.

In use, writing is accomplished by passing current, i, through the conductor bars 204, 206 to create magnetic fields $H_x$, and $H_y$. These magnetic fields produce resultant vector addition magnetic forces, M, at the crossover points 212 that are sufficient to selectively cause the magnetic orientation of the sense layers 218 to either coincide with the magnetic direction of the pinned magnetic layer 214 or to oppose it. Detection of the written state of the sense layer's magnetism can then be accomplished by determining the differential resistance in the tunneling magneto-resistive junction between the two conductor bars 204, 206 through the sense layer 218, the dielectric layer 216, and the pinned layer 214 depending upon the pinned layer's magnetic orientation.

Irrespective of the technology used to construct the memory devices 24, the storage device 10 is used to store information that the user deems important. For instance, the storage device 10 can contain contact information including addresses and telephone numbers; scheduling information including calendars and to-do lists; account information including bank account information and investment account information; medical information including user allergies and medical history; application files including word processor files and presentation files; entertainment features including games and movies; photographs; Internet settings and favorites; etc. Although this list provides several examples of the type of information that can be contained by the storage device 10, it is by no means conclusive. Accordingly, the storage device 10 can contain substantially any information that user may deem useful to carry with him or her.

Due to the high capacity achievable with the memory devices 24 identified above, a large amount of information can be stored with the storage device 10. For instance, the user could carry his or her entire medical file that details, for instance, the user's medical history complete with X-ray images, test results, and so forth. Also due to the high capacity of the storage device 10, computer applications (e.g., computer programs) can also be stored on the device along with the user's preferred interface preferences (e.g., desktop). Therefore, it can be appreciated that a wealth of information can be carried by the user in a minute package such that the user will always have access to information he or she values.

Use of the storage device 10 will now be discussed with reference to FIG. 8. In particular, this figure illustrates an example method for using the device to store and access information. As indicated in block 300, information of the nature described above is first stored on the storage device 10. Normally, this information is stored onto the device with a PC that includes a reading/writing device suitable for reading from and writing to the storage device. Once the desired data has been saved to the storage device 10, the user is free to carry the device, and the data it contains, along with him or her. Due to the extremely small size of the device 10, several carrying scenarios are possible. For instance, the device 10 could simply be carried in a pocket of the user's clothes or luggage, or the device could be worn on the user's person (e.g., around the neck) so that the information is always with the user.

When the user wishes to access information stored on the storage device 10, the device can be interfaced with a suitable foreign computing device as indicated in block 302. Normally, the computing device will comprise a PC. Preferably, the computing device is provided with an appropriate reading device that is capable of reading from the storage device 10. By way of example, the computing device can include a card slot that is adapted to receive the storage device 10 (similar to that of a flash card reader) so that the user can simply slide the storage device into the slot to interface with the computing device. In another arrangement, the storage device 10 can be provided with an adapter, such as a floppy disk emulator, so that interfacing can be obtained with an alternative reading device of the computing device. Interfacing could also be accomplished using radio frequency or other wireless schemes. In a preferred arrangement, the computing device will automatically begin to read from the storage device 10 upon insertion of the device into the reading device. With such an arrangement, the computing device needs little or no software configured to interface with the storage device. Operating in this manner, the storage device 10 can be used with substantially any computing device with similar results.

In that the information contained on the storage device 10 may be particularly sensitive, the storage device 10 normally instructs the computing device to request and confirm the user's password and/or personal identification number (PIN) before the information is made available as indicated in block 304. Optionally, different levels of security can be provided depending upon the sensitivity of the data being protected. Once the password or PIN has been accepted, the information contained within storage device 10 can be accessed. As identified above, the storage device 10 normally contains the user's interface preferences such that, upon initial reading of the storage device 10, the foreign computing device settings will be reconfigured to emulate the user's preferred interface settings as indicated in block 306. For instance, where the computing device is running a WINDOWS® system, the "desktop" shown on the display can be reconfigured to an orientation with which the user is familiar. Once the user's preferred settings have been assumed, information can be accessed in a conventional manner as indicated in block 308. Due to the reconfiguration of the interface settings, the user can quickly and easily access and use the information stored on the storage device 10. In addition, as will be understood by persons having ordinary skill in the art, the user can further access the Internet and his or her email accounts, if any. In other words, the user can utilize the foreign computing device as simply and easily as his or her own PC to access and use personal information.

Although most of the information contained in the storage device 10 is password or PIN protected, it is possible to partition the stored information, if desired. For instance, if the user wishes medical personnel to be able to quickly access his or her medical information in an emergency, the user can partition this information, or at least a portion of it, so that this information can be accessed by medical personnel without a password or PIN. On the other hand, it may be desirable to protect prescription information with digital authentication to ensure that persons other than the user cannot improperly obtain prescribed drugs. As will be understood by persons having ordinary skill in the art, it may be particularly desirable to wear the storage device 10 on one's person where a "medical bracelet" functionality is important to the user. Typically, all such medical data will be write-protected to prevent against accidental or purposeful deletion/modification of this data.

While particular embodiments of the invention have been disclosed in detail in the foregoing description and drawings for purposes of example, it will be understood by those skilled in the art that variations and modifications thereof can be made without departing from the scope of the invention as set forth in the following claims. For instance, although described herein as used with a computing device, it will be appreciated that the storage device could be interchangeable so that it could also be placed in a digital camera, MP3 device, or the like with which information can be read from or written to the device.

What is claimed is:

1. An information storage device, comprising:
   a connector for interfacing the storage device with a host computing device;
   at least one solid-state memory device contained within the storage device, the memory device holding personal information of a user of the storage device and further comprising logic configured to partition information that is stored, wherein a portion of the stored information can be accessed without a password or a personal identification number, and the other portion of the stored information requires a password or personal identification number to access the information, wherein the at least one solid-state memory device is an atomic resolution storage (ARS) device or a magnetic random access memory (MRAM) device; and
   a power member that provides power to the at least one solid-state memory device.

2. The storage device of claim 1, further comprising a controller contained within the storage device that communicates with the host computing device.

3. The storage device of claim 1, further comprising logic configured to reconfigure user interface settings of the host computing device.

4. The storage device of claim 1, further comprising means for reconfiguring user interface settings of the host computing device.

5. The storage device of claim 1, wherein the storage device is no larger than approximately 1.75×1.5×0.125 inches in size.

6. The storage device of claim 1, wherein the storage device has a storage capacity of at least 2 gigabytes.

7. The storage device of claim 1, wherein the storage device has a storage capacity of at least 10 gigabytes.

8. The storage device of claim 1, further comprising the connector for interfacing the storage device with the host computer device using a wireless communication device.

9. The storage device of claim 1, further comprising logic configured to request and confirm a password or personal identification number prior to accessing the information stored on the storage device.

10. A method for accessing information, comprising:

interfacing a storage device with a host computing device, the storage device comprising at least one solid-state memory device containing personal information of a user and comprising instructions that reconfigure user interface settings of the host computing device, the storage device further comprising logic configured to partition information that is stored, wherein a portion of the stored information can be accessed without a password or a personal identification number, and the other portion of the stored information requires a password or personal identification number to access the information; and retrieving information stored on the storage device with the host computing device.

11. The method of claim 10, further comprising entering a password or PIN prior to accessing the information stored on the storage device.

12. The method of claim 10, wherein the storage device is adapted to be carried on the user.

13. The method of claim 10, wherein the storage device is no larger than approximately 1.75×1.5×0.125 inches in size.

14. The method of claim 10, wherein the storage device has a storage capacity of at least 2 gigabytes.

15. The method of claim 10, wherein the storage device has a storage capacity of at least 10 gigabytes.

16. The method of claim 10, wherein the memory device is an atomic resolution storage (ARS) device.

17. The method of claim 10, wherein the memory device is a magnetic random access memory (MRAM) device.

18. The method of claim 10, wherein interfacing the storage device with the host computer is accomplished via a wireless communication device.

\* \* \* \* \*